US006175948B1

(12) United States Patent
Miller et al.

(10) Patent No.: US 6,175,948 B1
(45) Date of Patent: *Jan. 16, 2001

(54) METHOD AND APPARATUS FOR A WAVEFORM COMPILER

(75) Inventors: Annamarie Miller, Fountain Hills; Christopher Mark Chrulski, Gilbert, both of AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/019,293

(22) Filed: Feb. 5, 1998

(51) Int. Cl.[7] .................................................. G06F 17/50
(52) U.S. Cl. ........................................ 716/7; 716/1; 717/2
(58) Field of Search ..................................... 716/7

(56) References Cited

U.S. PATENT DOCUMENTS

| 4,309,756 | 1/1982 | Beckler ................................. 395/709 |
| 4,398,249 | 8/1983 | Pardo et al. ........................... 395/705 |
| 4,667,290 | 5/1987 | Goss et al. ............................ 395/707 |
| 4,789,944 | 12/1988 | Wada et al. ....................... 395/500.12 |
| 4,805,113 | 2/1989 | Ishii et al. ........................ 395/500.11 |
| 4,813,013 | 3/1989 | Dunn .................................... 345/333 |
| 5,123,103 | 6/1992 | Ohtaki et al. ......................... 395/600 |
| 5,544,066 | 8/1996 | Rostoker et al. ..................... 364/489 |
| 5,544,067 | 8/1996 | Rostoker et al. ..................... 364/489 |
| 5,553,002 | 9/1996 | Dangelo et al. ...................... 364/489 |
| 5,555,201 | 9/1996 | Dangelo et al. ...................... 364/489 |
| 5,598,344 | * 1/1997 | Dangelo et al. ...................... 364/489 |
| 5,864,862 | * 1/1999 | Kriens et al. ........................ 707/103 |
| 5,870,308 | * 2/1999 | Dangelo et al. ...................... 364/489 |
| 5,870,588 | * 2/1999 | Rompaey et al. ..................... 395/500 |
| 5,978,579 | * 11/1999 | Buxton et al. ....................... 395/701 |

OTHER PUBLICATIONS

Savage, Evaluation of design tools for rapid prototyping of parallel signal processing algorithms (Master thesis), NTIS, p. 123, Dec. 1, 1996.
Candence Design Systems, Inc. teach Front–end for SOC with HW/SW Strategy, Electro Manufacturing vol. 11, Issue 12, Dec. 1, 1998.

* cited by examiner

Primary Examiner—Kevin J. Teska
Assistant Examiner—A. M. Thompson
(74) Attorney, Agent, or Firm—Frank J. Bogacz

(57) ABSTRACT

The waveform compiler methodology employs a top-down system decomposition coupled with component based design development to capture a user design in a series of parameterized models. A user selects components from a library 160 to create a data flow of the application 102 and a block diagram of a target architecture 112. A partitioning 124 of the application model 100 to the architecture model 110 is specified as a mapping. The behavior 126 is specified as state-event-action 704 and/or scenario diagrams 706. The design is reduced to a software/programmable hardware executable form 175 using software techniques such as component concatenation 804, mapping 808, language compilation, parsing 810, regrouping 816, inlining 816, transformations, and optimization.

6 Claims, 10 Drawing Sheets

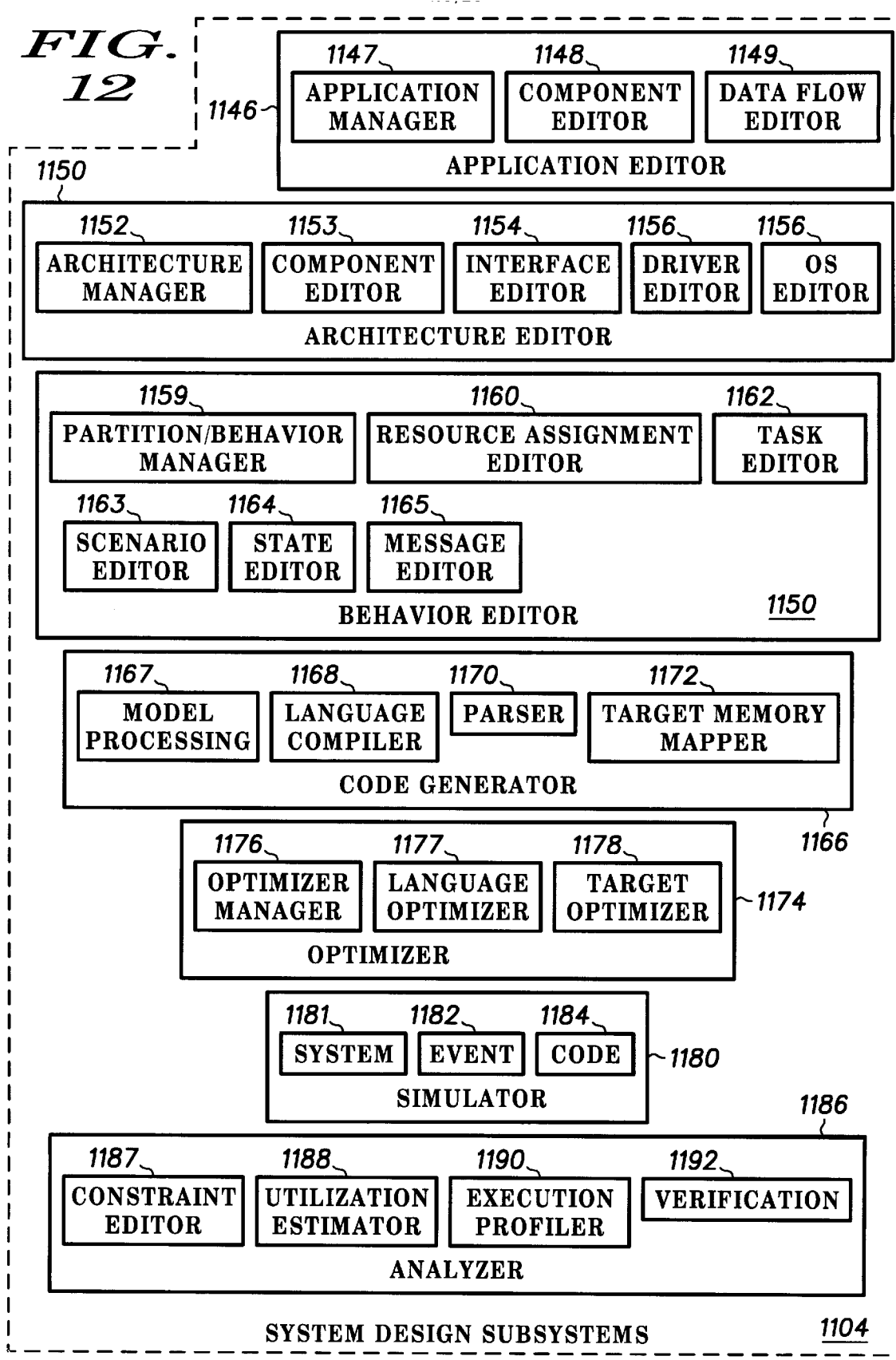

METHOD AND APPARATUS FOR A WAVEFORM COMPILER

CROSS-REFERENCE TO RELATED APPPLICATIONS

The present Application is related to co-pending U.S. patent application Ser. No. 09/018,574 having the same inventive entity and being assigned to the same assignee.

BACKGROUND OF THE INVENTION

The present invention relates generally to electronic based product development and more particularly to a method and apparatus for providing a design process to develop equipment to meet users' communication requirements. Presently, there are communication engineers that are adept at creating the processing for various communication waveforms. After waveform functionality is determined, the next step is to reduce the requirements and design of that waveform to a target implementation or to radio equipment for proving out equipment feasibility. No low cost or quick way of performing this step is available.

Traditionally, after the communications engineer completes waveform design and validation, teams for developing software, hardware, and systems develop and integrate a full communication system before feasibility is known. Efficient generation of algorithm waveforms as applicable to communication system development requires concurrent considerations in development, hardware architecture, software architecture, and the underlying technologies. Implementations of the traditional design process do not lend themselves to this once a partitioning between hardware and software has taken place because it is very difficult to rethink or replan the initial partitioning approach without significantly increasing cost and/or increasing cycle time. Vendor products support steps of the process but do not take the full system development and implementation into consideration.

Reuse of design or portions of implementations provide an approach to reduce cost and/or schedule of product development. However, reuse of previously developed designs requires text searches and evaluations, which is very time consuming and inefficient. In addition, the reuse of design or software code may not be possible because design reuse was not addressed during development or the code is not well documented.

Another approach to improve the cycle time of development is component based software development. However, component based software development is viewed as presently being inefficient because overhead is added when modules are combined. Increasing processing overhead is especially undesirable in embedded digital signal processor application designs where speed and size are critical parameters.

Current computer aided development technology has focused on generation and optimization of hardware design synthesis rather than on software. While there are commercial efforts in this area they address part of the process of the present invention but do not provide a seamless approach to total system/software development. None of the electronic based communications development aids such as Cadence®, ALTA®, SPW®, and HDS® have component based system development for heterogeneous multi-processor systems. Additionally, none of the above development aids nor the synthesis systems such as Synopsys COSSAP® and Design Compiler® have a means to partition application functionality to a target architecture.

The primary focus of the above commercial development systems as well as ViewLogic® and ACD DSP CANVAS is the direct synthesis to hardware. Other development systems such as Mentor Graphics and DSP Station and the above systems all have synthesis to software for programmable hardware only as a secondary focus. This results in all of the presently available commercial development systems being much more inefficient than desired for software synthesis. Other drawbacks of the present technology include the lack of code optimization for such aspects as: retargeting, C, embedded, or assembly.

Accordingly, it would be advantageous to have a method and apparatus for a waveform compiler that provides waveform application development, allows partitioning of that application functionality to a target architecture, and further provides a way of generating and optimizing code and ancillary target software for use in communication systems.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 3 provides a flow of the application model creation in accordance with the design methodology of the present invention.

FIG. 4 provides a flow of the creation of source code for the application model in accordance with the design methodology of the present invention.

FIG. 5 provides a flow of the architecture model creation in accordance with the design methodology of the present invention.

FIG. 6 provides a flow of the partition model creation in accordance with the design methodology of the present invention.

FIG. 7 provides a flow of the behavior model creation in accordance with the design methodology of the present invention.

FIG. 8 provides a flow of the target code generation and optimization in accordance with the design methodology of the present invention.

FIG. 9 illustrates a flow of simulation and analysis capabilities in accordance with the present invention.

FIGS. 11 and 12 are a top level illustration of the software functions which provide the preferred embodiment of the top level system design presented in FIG. 10 in accordance with the present invention.

DETAILED DESCRIPTION OF A PREFERRED EMBODIMENT

Figure 1:
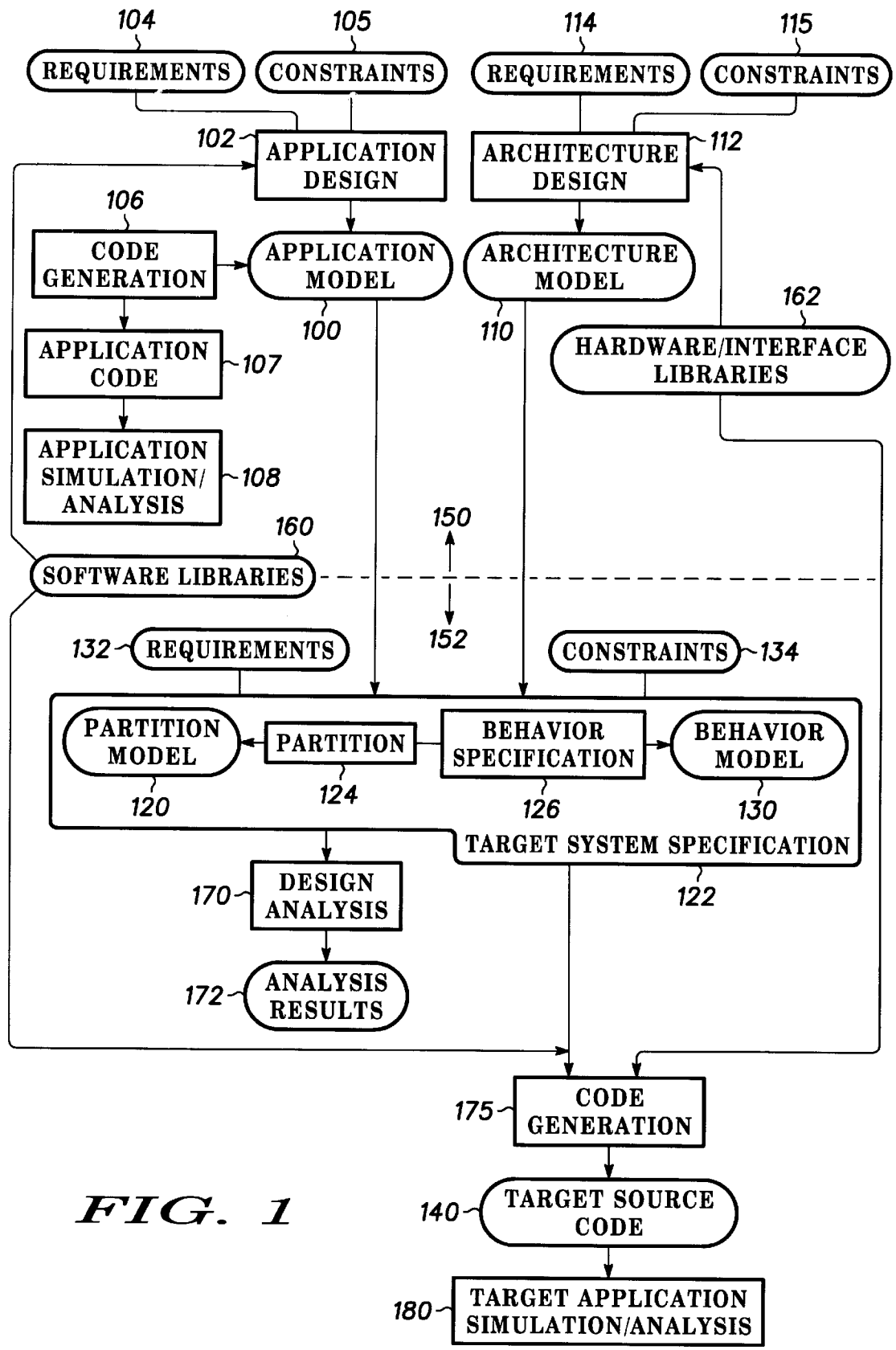
FIG. 1 is a block diagram depicting the waveform compiler methodology and architecture for implementation of the concept in accordance with the present invention.

In accordance with the present invention, a novel method and apparatus for a waveform compiler design process architecture will be presented. The method and apparatus of the present invention facilitates present day product development issues such as:

Increasing system complexity and control functionality without relief for critical parameters. Critical parameters include design parameters of throughput, size, and weight, and critical business parameters of least time to market at the lowest cost, which are addressed by the present invention;

Today's designs require varying domain knowledge. It is difficult for an engineer to be knowledgeable in all areas of design and implementation to rapidly and independently derive efficient communications algorithms. An environment which can compliment an engineer's domain knowledge to meet critical design and business parameters is truly desirable. Today's design environments support only parts of design synthesis. The environment of the present invention includes design of an application and reduction of that design to desired target hardware and includes considerations for addressing domain areas possibly not germane to the communications engineer;

Little support for full system feasibility design and analysis without incurring cost of a full development cycle of a system, software and hardware team. Traditionally, three engineering teams are retained through an entire development cycle to create a communications product to prove out feasibility. In the traditional development process a waveform algorithm designer or communications engineer provides an algorithm design and validation of a waveform to meet a customers communication requirement. Other systems engineers participate in the design of related areas such as security and data acquisition. Hardware/software partitioning is then determined for functionality of the requirements. The systems architecture team, hardware development team, and software development team develop the system. Final integration and test teams merge the subsystems. The present invention provides a concept to create a development environment for design, verification, and maintenance of waveforms and changes the traditional development cycle;

Difficulty to reuse design and code because of manual feasibility analysis. Reuse has been employed to facilitate development but traditional text search and reuse techniques can be costly because prior work has not been designed for reuse. The waveform compiler approach of the present invention overcomes this limitation to developing communication equipment;

Little support for full system iterative design. Revamping partitioning is difficult. Efficient generation of algorithms requires concurrent considerations in algorithms development, hardware architecture, software architecture, and the underlying or related technologies specified for the application and the system. Implementations of the traditional approach do not lend themselves to this once a partitioning of hardware and software has taken place. In the traditional approach, it is very difficult to rethink/replan the initial partitioning approach without significantly increasing cost and/or extending schedule. Available vendor products support steps of the process, but presently do not take the full system development and implementation into consideration as is provided in the present invention.

FIG. 1 illustrates the block diagram of the methodology of the present invention. The present invention discusses the method and apparatus in the domain of waveform design. In practice, the method and apparatus can be used in other application domains. Modern computer based electronic application systems are comprised of an application which provides some sort of desired processing, an architecture comprised of hardware processing element(s) and interfaces combined into a machine with specific scheduling rules and requirements, a partitioning of an application to the resource element(s) of the architecture, and behavior strategies for how the application behaves on the architecture and in its operational environment.

The methodology of the present invention provides steps to decompose a total system into the input/output/processing representing all system facets of the problem domain with enough resolution for the solution software to be generated. This software can be used for feasibility analysis or for product use. The representations included are an Application Model 100, an Architecture Model 110, a Partition Model 120, and a Behavior Model 130 from which target source code 140 is generated. In the present invention, the separation of the Target Application Independent models 150 from the Target Application Dependent models 152 allows reuse of the application and facilitates porting applications to other architectures. The Application Design 102 and the Architecture Design 112 are shown in parallel because they are order independent.

In the methodology, the communications engineer is given requirements 104 and constraints 105 for the application waveform. The communications engineer creates the application design 102 to meet the requirements 104 and constraints 105 through selection and interconnection of reusable modules provided in software libraries 160. The Application Design 102 includes parameterization and customization of the processing. The resulting Application Model 100 is a functional model of the detailed processing steps required to meet the user requirements 104 and constraints 105. The output of the Application Design 102 process is the Application Model 100. The methodology provides Code Generation 106 of the Application Code 107 for the Application Model 100. Application Simulation and Analysis 108 through execution of the Application Code 107 further verifies the correctness of the Application Design 102 to the requirements 104 and constraints 105.

The Architecture Design 112 step of the methodology is similar to Application Design 102 step. Again, the engineer is provided requirements 114 and constraints 115 for the architecture. The engineer may create a new Architecture Design 112 as a block diagram through selection and interconnection of hardware and interface modules from a reuse library of hardware templates and interface methods 162 or by selecting an existing architecture also contained in the library 162. The Architecture Model 110 is a representation of the target hardware configuration and hardware processing considerations in which the application will execute. It provides a static view of the hardware inputs and outputs, messages, interfaces, scheduling mechanisms, interrupts, and processing limits of the target hardware in a fashion which can be reduced to a kernel for hardware management.

The next step of the methodology is to merge together the Application Model 100 with the Architecture Model 110 creating the Target Application Dependent 152 specification for a system. The steps involved in the Target System Specification 122 include partitioning 124 of the processing components of the Application Model 100 to the hardware processing elements defined in the Architecture Model 110 and Behavior Model 126. The Behavior Specification 126 provides definition of system tasks, application tasks, threads of execution, and state definition forming the operational rules by which the application must function on the architecture to meet requirements 132 and constraints 134 of the target system. The Partition Model 120 is a mapping of required processing to available resources. The Behavior Model 130 is defined by state machines and/or scenarios.

Once all models are defined, the methodology allows feasibility Design Analysis 170. The methodology provides estimators, profilers, and computations to allow evaluation of the proposed system without total reduction to the target hardware. The engineer may find based on the Analysis Results 172 that iterative refinement of the specifications are needed to arrive at a suitable solution for the requirements 132 and constraints 134.

The next step in the methodology is Code Generation 175 of the Target Source Code 140. This includes code optimized appropriately for the target processing elements, and initialization and configuration code for the processing elements.

The final step of the methodology is Target Application Simulation and Analysis 180 completed through execution of the resulting source code through simulators and/or emulators for the target and analysis of the outputs.

The methodology provided in FIG. 1 integrates various levels of development by:

providing an iterative environment for waveform algorithm, hardware and software development using partitioning/behavior;

assisting the systems/communications engineer or user of the waveform compiler process in generation, simulation, and optimization of algorithm implementation, trade-off decisions for hardware/software partitioning, and performance evaluations using static analysis, and resource utilization and system profiling;

improving the design, development and maintenance cycle time and reducing risk for hardware and software through creation, evaluation and reuse of standard modules with well defined interfaces using component repository and internal structure;

supporting integration and test of target implementations on the development platform by interfacing simulation/emulation communications for multi-processor hardware using simulators;

reducing the manpower requirements through all development phases by providing the communications engineer capabilities to reduce and evaluate the waveform to the target hardware and/or software;

changing the development paradigm. Hardware and software teams can focus on creating specific modules for the libraries with reuse as a key design consideration to provide code generation and synthesize internal structure into optimized target executable code.

Figure 2:
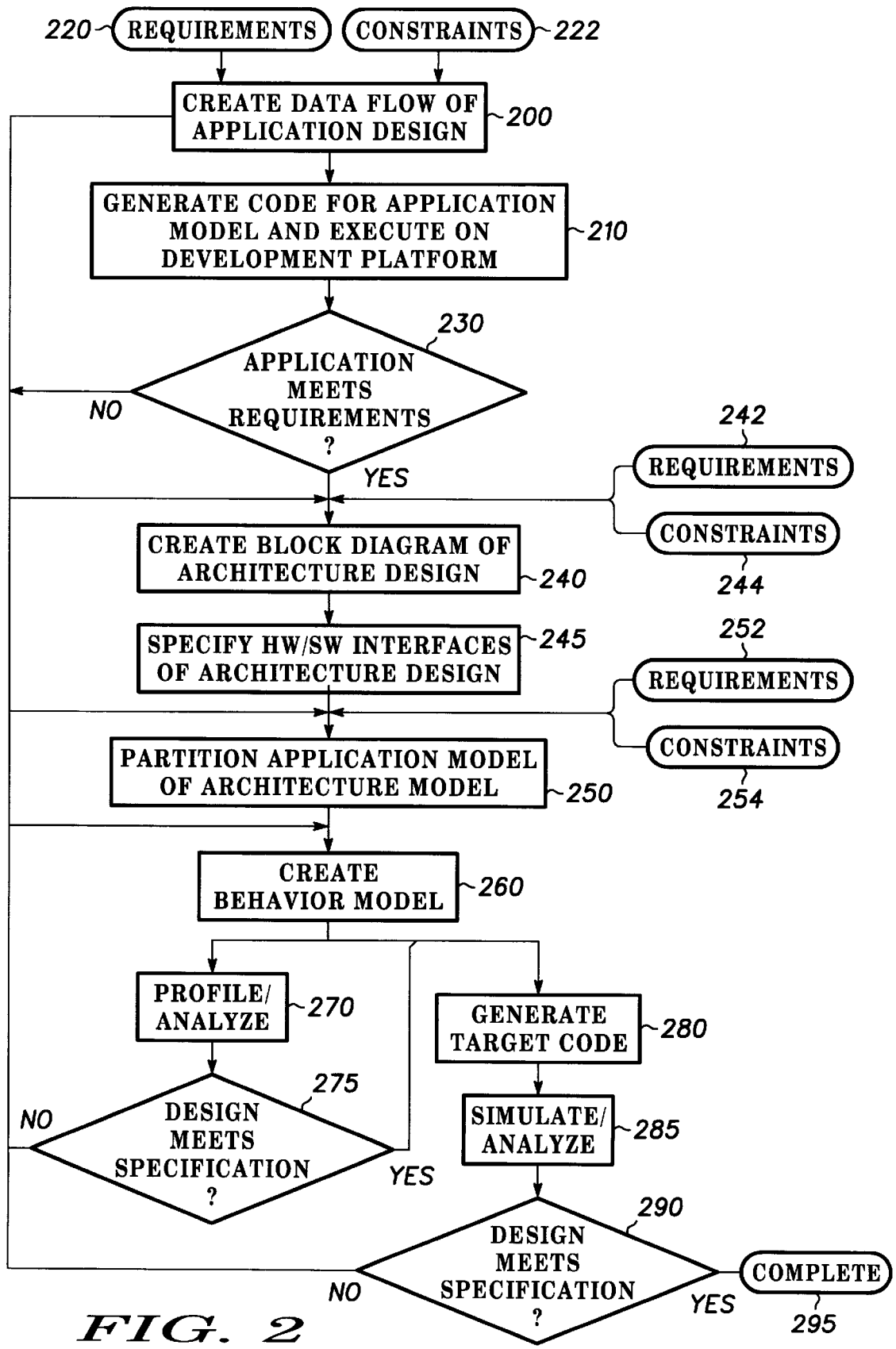
FIG. 2 is a flow diagram of the design process steps of the methodology in accordance with the present invention.

FIG. 2 provides a flowchart for the present invention. The present invention creates models from which an implementation form can be mapped and executed on a target platform.

The first step in the iterative process is to design the application waveform per specifications and verify it. This is typically a signal processing functional math model and is comprised of one or more functional models of various waveform functions (e.g., transmit, receive, etc.). Creating this requires user knowledge of a requirements and constraints of the functional model design without regard to the target architecture.

The designer creates a functional data flow of the application design 200 from building blocks provided in libraries as referred to in FIG. 1 or creates new ones which can be put into the library. The user designs the application model to meet application requirements 220 and constraints 222. Once the models are completed, code can be generated for the equivalent application model and executed on the development platform 210 to verify operation. In the methodology, verification utilities are accommodated such as prints and plots of data resulting from code execution or simulation to assist the designer in determining that the application meets requirements 230 and iterating the porcess until it does. If the application does not meet requirements, the designer may revise the application model and analyze again.

If the application model meets requirements, the user creates a block diagram of the architecture design 240 of the hardware processing elements, interfaces and architecture level processing strategies to meet architecture requirements 242 and constraints 244. This is accomplished through creation and parameterization of hardware component elements which represent a processing element such as a Digital Signal Processor (DSP). The component representation resident in the libraries carry pertinent physical implementation about the processing element. Elements can be connected and interfaces specified 245. Additionally, the user can define through selection, specification and parameterization a process scheduling strategy for the physical processing media.

The mechanisms of the present invention allow the user to partition the processing elements of the application to the physical processing resources of the architecture 250. The methodology provides resource utilization information, characterization information for the waveform performance per target specific modules, the system architecture and other system requirements 252 and constraints 254 to provide a preview to the designer of the estimated performance;

Next, the mechanisms of the present invention create the behavior models 260 which specifies how the application behaves on the physical architecture. Behavior is specified with state machines and scenarios which are flattened into threads of execution based on events and/or conditions;

Analysis given all descriptions of the application, architecture and architecture behavior can be achieved through static or dynamic analysis. The mechanisms of the present invention provide static analysis through profiling 270 the proposed design using algorithms which estimate the specifications into an execution order. This offers gross identification of possible conflicts in processing, trade analysis for throughput, memory or other system parameters. If the designer selects this step and the design does not meet specifications the designer may iterate through any of the previous steps 275. The designer may choose to generate target code 280 with or without completing the profiling. The mechanisms of the present invention also allow for dynamic analysis through generation of target code 285 and interface to instruction/implementation level simulation/emulation for the software and physical hardware. This provides more precise determination of design suitability prior to actual system hardware availability.

If the design meets all specifications 290, the design is ready for the target implementation. If not, the mechanisms of the present invention can be iterated at any of the previously defined steps.

FIGS. 3 through 9 further elaborate the steps of the flow illustrated in FIG. 2.

Figure 3:
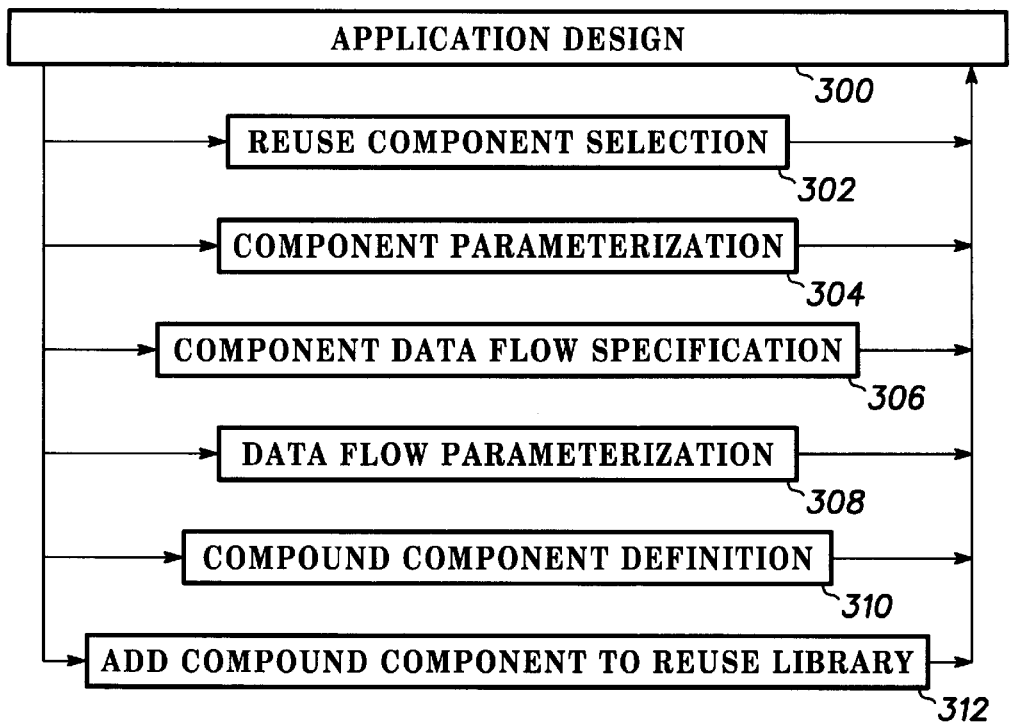
FIGS. 3–9 provide a second level of resolution for the flow provided in FIG. 2.

Referring to FIG. 3, application design entry 300 as identified in FIG. 2, allows the user to select components, parameterize them, and select software to software interconnect methods. This is an interactive process performed by the user composed of the following steps: Reuse Component Selection 302, Component Parameterization 304, Component Data Flow Specification 306, Data Flow Parameterization 308, Compound Component Definition 310 and Add Compound Component to Reuse Library 312. There is not a firm ordering of these steps, and the user is free to perform the steps as appropriate.

The Reuse Component Selection process 302 involves selecting software components which meet the functionality required in the application design. The waveform design is entered by selecting a set of components and interconnecting them into a dataflow graph. A component can be a standard component provided in the reuse library, a user defined component or a packaged design made up of other components. The user maps each block in the functional representation to select building blocks from libraries of components. The library components represent available target implementations of the function. The designer can select a specific target component for the selected building block of the waveform. User component selection is based on considerations of prior use, language, and performance estimates as specified in the component attribute information.

Once a component has been selected, the user may wish to enter the component parameterization step 304, where details of the components operation are given by the user. Some components have user definable internal parameters. The user is responsible for providing values for each of these parameters. For example, an FFT component could have a parameter for the number of bits it operates on.

As components are added to the model, the user may perform Component Data Flow Specification 306. This enables the user to specify that data should flow from the output of one component to the input of another component.

An issue with component based development is that I/O data types may differ between components. The waveform compiler development environment checks if a conversion can be made for the data element and let the user know. The user could agree to the conversion or select another component with the same data type. The waveform compiler lets the user know of any impacts or restrictions.

For each data flow created by the user, the user may wish to perform Data Flow Parameterization 308. In the signal processing domain, many functions can be performed on a sample by sample basis, or on a vector of data samples. For example, a FIR filter can process each sample individually or as a vector of many samples. Depending on the requirements for throughput of the application the user needs to select a method to use. If the user selects vector processing, the user then parameterizes the data flow by defining the buffer size of the vector input or output of the component. The data flow connections can also be named by the user. If so, the names chosen appear in the generated source code. The user can specify the parameters for the implementation of the interconnect to use. The environment gives the user a list of valid implementation methods to choose from, such as local variable or global memory.

To make the functional model more readable, several components can be grouped together to define a compound component 310. This new component is then shown in place of the sub-components on the diagram. This step can be repeated to create new components from other components or compound components. The result is a hierarchy of increasingly detailed levels of the design. The user is able to descend into hierarchy components to modify any level's internal functional model.

A compound component can also be used to expand the reuse library of software components. An optional step in the creation of an application model is to place the compound component back into the database for use in other designs 312. When a compound component is placed into the database, the user specifies parameters and descriptions of the component that make it possible for other users to access this component. If this component is placed back into the database, other application models can use this component just as easily as using any of the other components. An example of this would be creating a compound component that implements a modulation scheme from mathematical components that define its functionality. Assuming the component meets desired constraints, another user would then be able to specify use of this modulation scheme just by having it placed into the design, without having to redesign the built-up functionality.

The preferred embodiment of this process is to provide the communications engineer with a domain-oriented visual language. The preferred representation of this language is implemented with a graphical user interface that shows a data flow graph, but a textual description could also be used. On the data flow graph icons represent the reuse components, with leads representing inputs and outputs of the components, and lines represent movement of data between components. The preferred embodiment also includes file management so the user can save the application model to disk and put it under configuration management.

The end result of this process is an implementation form of the application that can be converted into source code from the reuse modules stored in a reuse library. Creating this requires user knowledge of a functional model design without regard to the target architecture.

When developing any system various verification steps are desirable as checkpoints for the suitability of the approach. The method and apparatus of the present invention supports intermediate analysis steps. Referring to FIG. 1, part of the methodology involves verification of the user design against the application requirements. One method of verification included in the process is to create code for the application model and execute this code. In order to allow this to occur early in the process, there is a functional software test that takes place on the development platform eliminating the need to have target hardware built in order to perform initial application testing. Later when the target hardware is available, code can be generated from the same model for that architecture eliminating the need for the user to rewrite code when the target becomes available.

Figure 4:
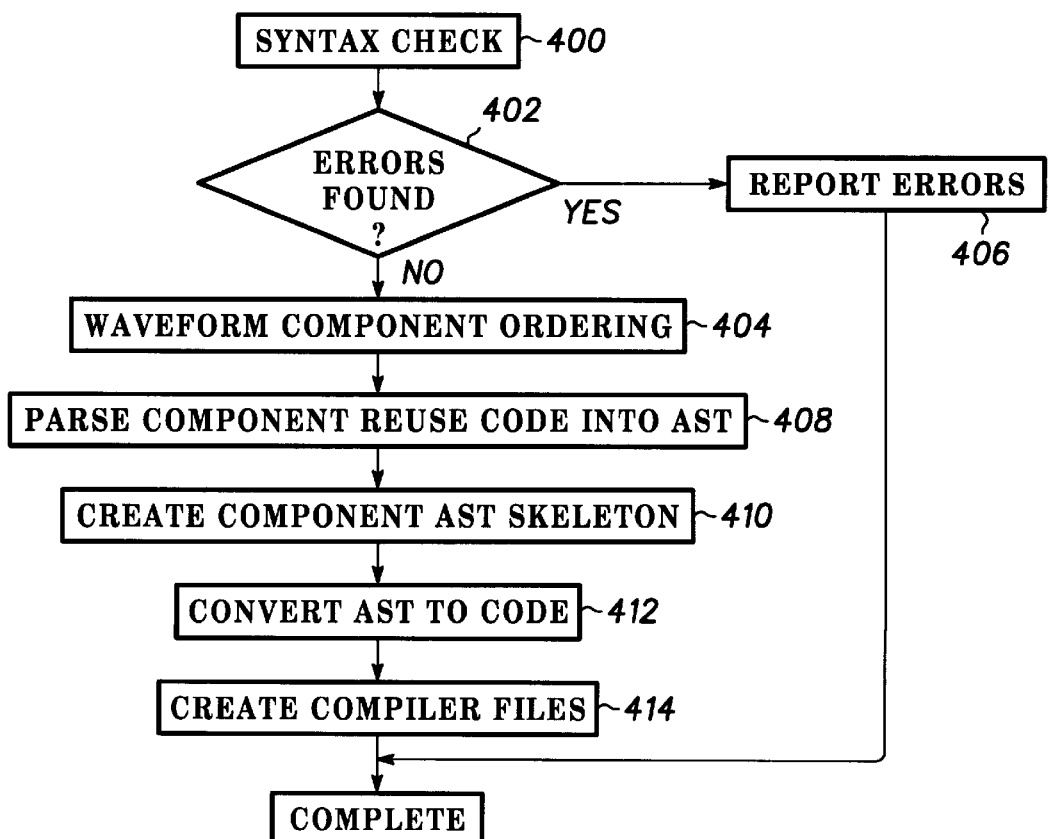

The processing steps for generating code of the application model is given in FIG. 4. The first step of this process is to perform a Syntax Check 400. This syntax check verifies the completeness and validity of the application model. The completeness checks ensure that all information needed for code generation has been given. Each of the components in the model is checked to verify that all parameters are given values. The components are also checked that inputs to components are either specified as a constant or are provided data from the output of a preceding component. Each of the inputs and outputs of the components are also checked to ensure that any vector lengths are specified. The second type of check is the validity check. This check enforces the rules and constraints of the design methodology. Rules of the design methodology include allowing a component input to only receive data from a single component output and that data types must be compatible or a conversion is possible when data is moved from one component to another If there are errors found 402 during the syntax check 400 an error report 406 is generated for the user, and the code generation process is aborted.

If no errors are found 402 the code generation process continues on to Waveform Component Ordering 404 which places the processes in order. The application model contains data processing blocks and data specifications that define the application. The processing blocks define the processing to take place which may be in a sequential form or a parallel form. In order to generate code for this processing, a structured list of steps must be constructed. This structured list is stored in memory as a list of blocks that contain processing steps or sub-blocks which define loop and conditional processing. The process to generate this list is based on analysis of the data flow specifications in the model. The analysis process examines the data flows to determine which components produce data for other components, because in the structured order the data producer must execute first. Some data producers may also require components to produce data for them, so an iterative process is followed of ordering some components, then reexamining the remaining components to determine which components have had their data producers already ordered.

After each of the components are ordered, Define Code Variables 405 maps the data flows of the application model to the physical variables. Next, the source code for the components is extracted from the database and parsed into an Abstract Syntax Tree (AST) 408. Creating an ordered duplicate of the source code allows component customization to user specifications without altering any library forms. The code can also be optimized in this form to improve the execution speed of the analysis code. The parsing of the source code is performed with available tools, such as lex and yacc. The internal data structure that contains the component ordering information is converted into the AST 410 and the AST skeleton is created. This internal structure provides a way for inputs and outputs of the components to be manipulated in a consistent way between the component code and the code that makes the calls to the components. The total AST structure containing the components and the calls to the components can then be converted into source code 412. The conversion process is performed by mapping the AST notation to a corresponding source code instruction. After this step is performed the user has source code files that are ready for compilation. To aid in the compilation process, auxiliary files for compiling the code are created 414. These files contain the instructions for compiling and linking the source code into an executable. At this point the user is able to create an executable application that implements the application model. This model can be run to verify the correctness or identify changes needed in the model. As indicated in FIG. 1, the verification process allows simulation data to be input to the code, and data flows from the model to be captured in files or reports for the user to examine. If changes are needed the user is able to go back the application design step to modify the model, and then repeat this process until the model is acceptable.

Figure 5:
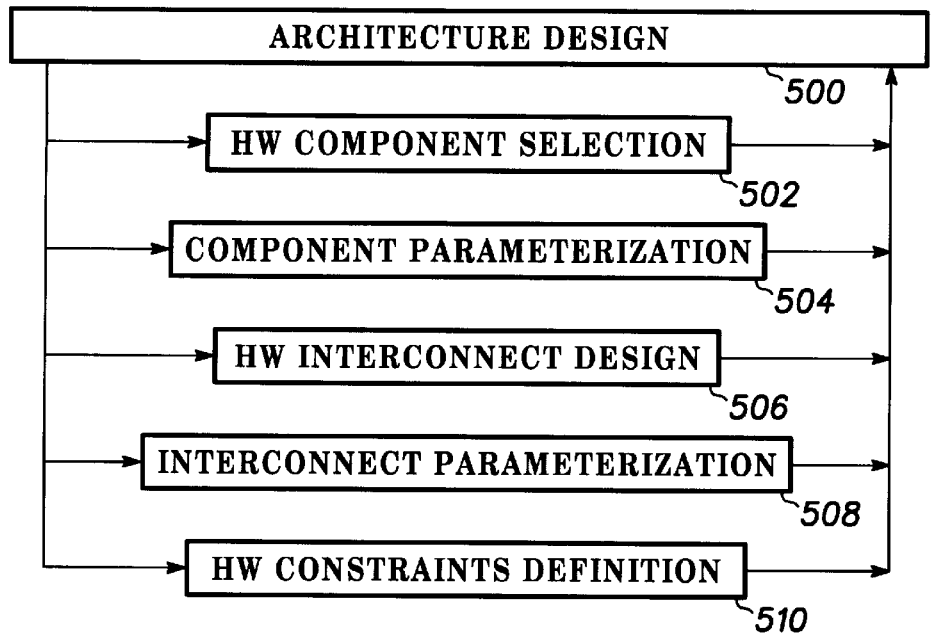

Referring to FIG. 5, the method and apparatus of the present invention support code generation to a target implementation in an optimal fashion through specification of the physical architecture design and behavior at a system level and a hardware component level. The Architecture Design 500 step allows the user to give a target specification as a block diagram with parameterized components.

As with creation of the application functional model, creation of the architecture model referred to in FIG. 2 is an interactive process. The major steps taken by the user in this process are Hardware Component Selection 502, Component Parameterization 504, Hardware Interconnect Design 506, Interconnect Parameterization 508, and Hardware Constraint Definition 510. The user completes each of the steps needed to define the architecture they intend for the application.

A library of hardware and interface templates is provided for the user to select components 502 that will be part of their architecture. The target system architecture is created through identifying hardware computational elements, communications elements, and topologies. Computational elements includes types of hardware (e.g., processors, ASICs, and/or FPGAs), numbers of each of the hardware elements, size of the memory element, degree of coupling between processor and memory, software and algorithms utilized, and types of instruction sets. Communications elements include buses used, backplane considerations, interfaces to buses within the system, and interfaces to environment, routing, and communications protocols. Topology considerations include allocation of physical resources, interconnections, and technology, I/O configuration, integrated test and fault tolerant capabilities.

There are several classes of hardware components, each of which have unique traits that are taken into account in creating analysis and eventually code for the user design. These include off the shelf DSP modules, such as the TI C40 and Motorola 56K family, memory components, FPGA component modules, and interconnect modules. Typical information that the Waveform Compiler Development Environment needs in order to generate code, perform optimizations and profiling of waveforms created for these architectures is included in a hardware template contained within the hardware library. Through this step the architecture model begins to take shape with one or more processors or FPGA modules.

After elements of the architecture have been selected, the user is able to provide parameters of these components 504. Parameters are specific to each library component. Typical parameters are information such as clock speed and the operating system tasking model.

The user is also able design hardware interconnects 506 after component selection and parameterization. The interconnection design is used to identify pin usage or bus constructs that are used for movement of data from one component to another.

Each of the interconnections 508 that the user creates can be to be parameterized by the user. These parameters identify the software drivers needed for this interconnection and the protocol uses.

Constraint information (e.g., available memory, throughput allocations, etc.) is used in the design analysis step referred to in FIG. 1 to compare the estimated resource utilization with the desired resource utilization. The tool environment embodying this methodology provides Hardware Constraint Definition 510 through defaults and user inputs. The default information is extracted from component attribute information available for architecture components. The user can change the default settings. Where defaults are not appropriate, the environment leaves these values blank and asks that the user insert appropriate values. The user also is notified when necessary constraints are not defined.

The preferred embodiment of this process is to create a block diagram of the architecture model with a graphical user interface, although a textual description is valid as well.

To this point the application is kept independent of the architecture. Separation of the application from the architecture is important because the application is kept free of architecture dependent specifics which can limit opportunity for future retargeting. The methods and apparatus of the current invention merge the application and the architecture through specification of the system behavior. There are two levels of behavior information to define;

the processing tasks, the processing tasks composition, and processing tasks execution media. A processing task is a logical thread of execution within the application model. It is composed of one or more functional components of the application model and is assigned to execute on a hardware processing element per a defined scheduling strategy;

the system tasks, the system tasks composition, and stimuli and response orderings which invoke processing or system task execution. A system task is a logical thread of execution and is composed of one or more processing tasks. In response to interrupts, or events, a certain execution order of processing and/or system tasks are appropriate. A state diagram and/or scenario diagrams define the stimuli and response ordering which complete a system behavior description.

Figure 6:
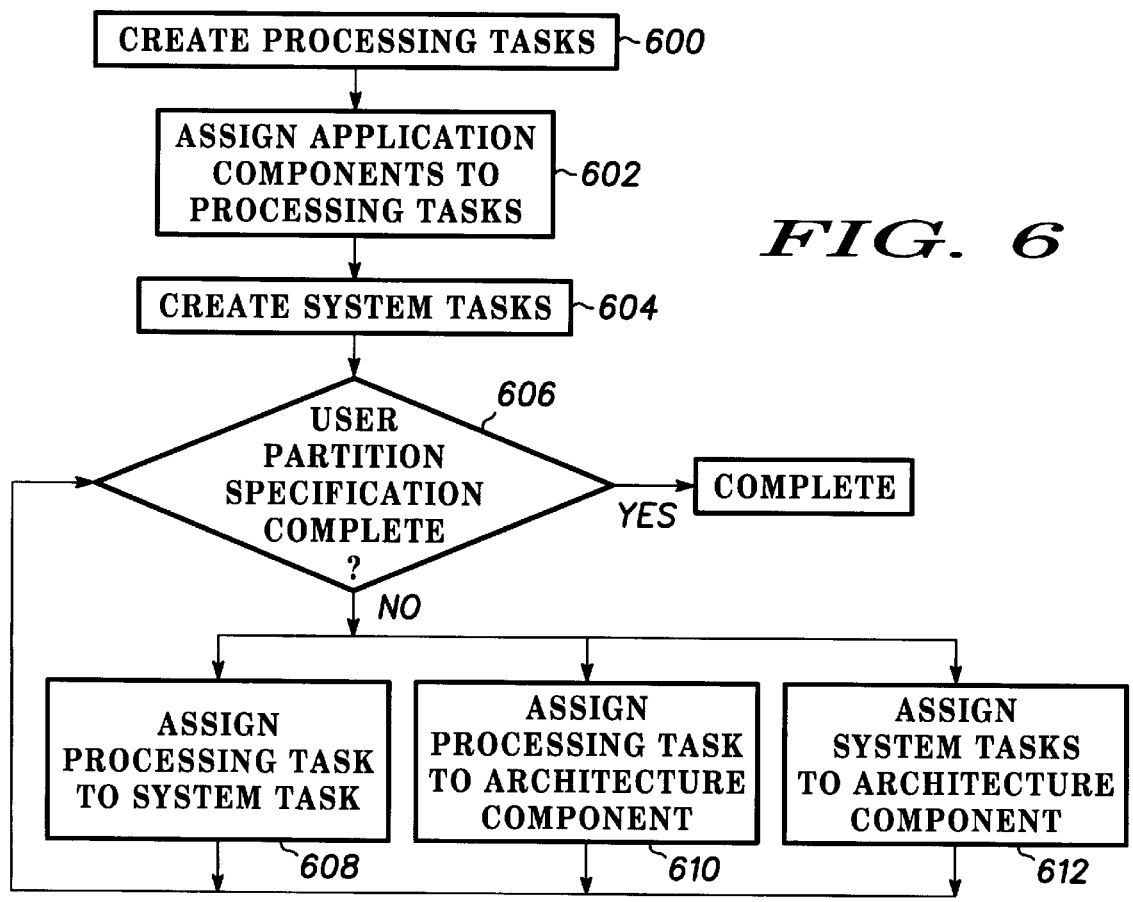

Referring to FIG. 6, the methods and apparatus of the present invention provide for definition of processing and system task through a partitioning process. The partitioning maps the application model functions to the target architecture model elements to form a partition model of the target implementation. Partitioning is an interactive step that begins with the developer creating processing tasks of the application 600. An example of a processing task is a combining of multiple math functions into a modulation scheme. The user identifies the processing task by name and assigns the components from the application model to that processing task 602. The creation of tasks and assignment of components to tasks continues until all the components of the application are allocated. While the user is assigning a component to execute in a specific processing task, a target specific implementation form may be specified. To accommodate this, the reuse library contains versions of code for components that are target independent, and versions that are target dependent.

Figure 7:
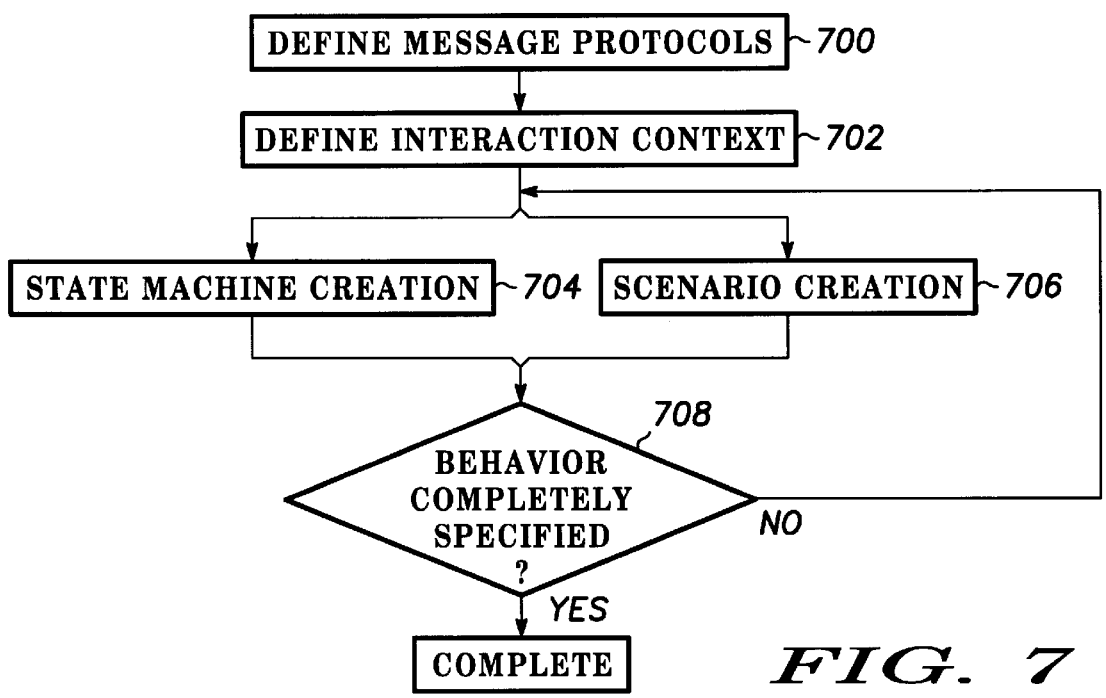

System tasks can be created 604 which allow for behavioral specification to take place in the behavior specification step of the methodology, FIG. 7. System tasks are a high level description of the tasking involved in the system application. For example, system tasks may be created for producer and consumer tasks, but the actual processing that makes up these tasks is composed of one or more smaller processing tasks. The modulation processing task could be assigned as a step in a transmit function which could be part of a producer system task. A step in the process of the present invention allows the developer to assign processing tasks to the system tasks 608 allowing this decomposition to be detailed. Each of the processing tasks is assigned to execute on a specific architecture component 610, such as a processor or a FPGA. The developer also assigns the system tasks to an architecture component 612 to specify where the behavior management code of the task takes place.

Referring to FIG. 7, once the processing tasks, system tasks, and the architecture are defined, the system behavior is modeled with state machines and scenarios. This modeling requires input from the user for each of the tasks of the system, along with a static context description. The context description gives the definitions of which tasks interface with one another, and which tasks interface with items outside the scope of the model. The interface definitions also contain detailed descriptions of message structures that are sent and received by tasks. Each of the message structures gets defined as a series of fields that are combined to form a complete message. These message structures are grouped together into a message protocol 700. The message protocol is then used to define a task interface. A complete interaction context 702 is formed by defining all the system tasks and interfaces of the system. This context provides a high level view of the system. For example, a producer-consumer system architecture has two tasks. The producer task sends messages across an interface to the consumer task. This interface is matched with a protocol that defines the valid messages that are sent between the producer and consumer. The protocol can contain a multitude of messages, allowing for different types of data to be passed to the consumer task.

After a context has been defined, the methods and apparatus of the present invention provide for the behavior of the system within that context to be detailed. There are two modeling techniques used for specifying this behavior: state machines 704, and scenarios 706. When modeling with state machines either a graphical state machine diagram or a textual state event matrix is used. These forms provide a definitions of states, events, transition actions, and state actions for each of the tasks. In the producer-consumer example, a detailing of the consumer task as a state machine involves specifying states and event transitions that occur inside the task. A state where the task is waiting for a message is defined, and transitions to other states that are dependent on the exact message received may be defined. These other states contain action definitions that result in the execution of processing steps defined in the application model.

A scenario definition provides a description of behavior, by grouping a series of events and responses into a thread of execution. This event-response behavior is specified by defining a received event to a task and the actions that the task effects as a result. An alternative method of defining the above state machine behavior is to define scenarios for each type of message the consumer task receives and the resultant actions for that particular event.

The behavior specification continues in a top-down approach for all the tasks of the system until the user has defined a enough description of the behavior such that code can be synthesized 708. Using an iterative design approach, the user may perform simulation/analysis on these models, and then refine them by providing more detail.

Figure 8:
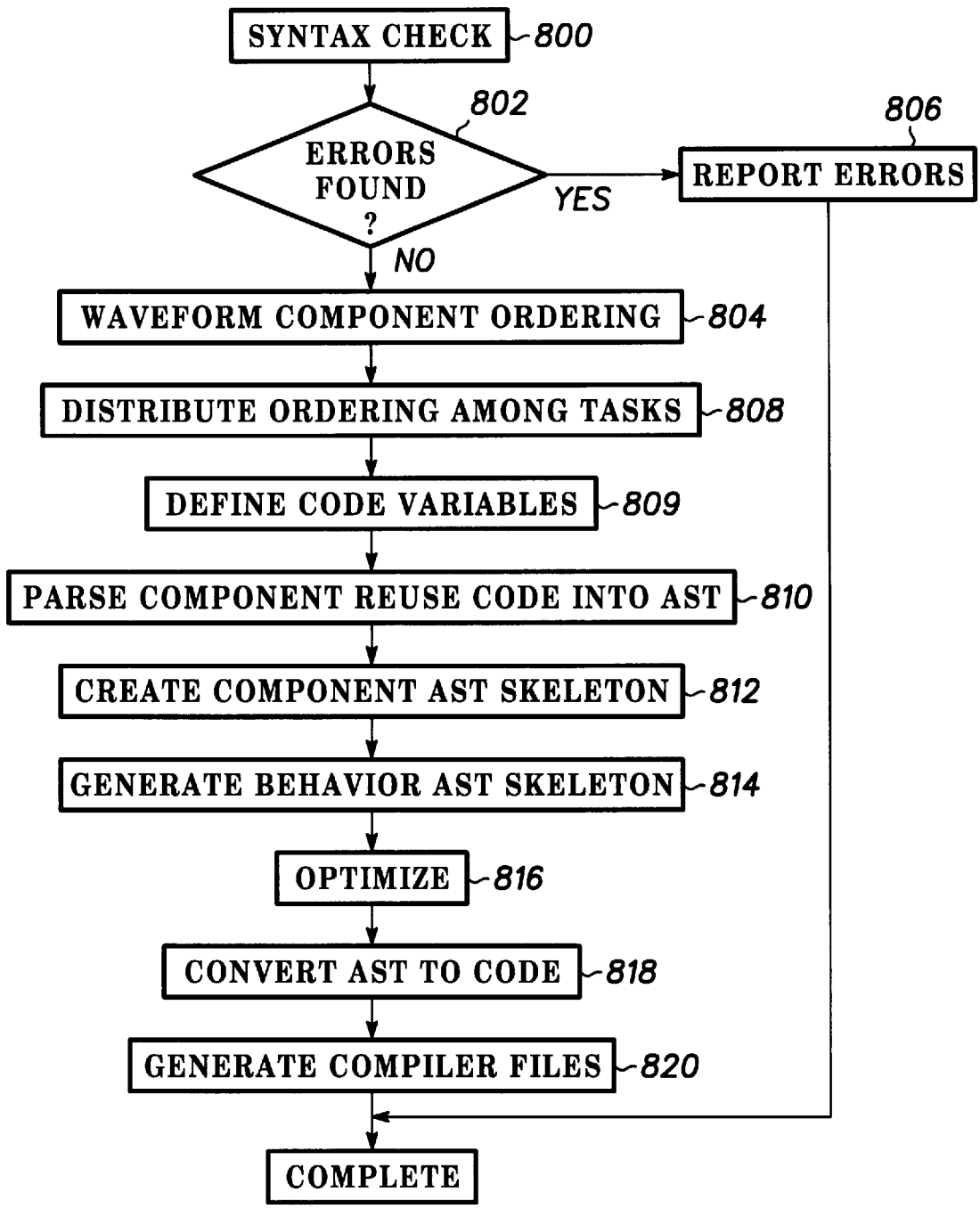

Given an application model, an architecture model, a partition model, and a behavior model, the methods and apparatus of the present invention provide Code Generation/Optimization. Referring to FIG. 8, the system code generation process is based on the code generation for the application model process (referring to FIG. 4), with additional processes to support architecture dependencies, heterogeneous multiprocessors, and system behavior.

The first step in code generation and optimization is a Syntax Check 800. The syntax check performs the checks described earlier in FIG. 4 for the application model. Completeness and validity checks are also performed on the architecture, partitioning, and behavior model, along with additional checks for consistency.

Consistency checks are necessary because the system code generation process is extracting data from the application model, architecture model, partition model, and behavior model. The models need to be unified into a single system view which requires all the models to be consistent. An example of this is the partition model, which maps components to tasks and tasks to the architecture. These mappings must be checked to ensure that the referenced components and architecture components are properly defined in the application model, and the architecture model respectively. If there are errors found 802 during the syntax check an error report 806 is generated for the user, and the code generation process is aborted.

If no errors are found 802 the code generation process continues on to Waveform Component Ordering 804 by placing in order the processes. The component ordering step is the same as described earlier in FIG. 4, but it is now followed by a step that distributes the ordering to tasks 808. For applications that are to run as a multitasking system, the ordered components need to be separated into code segments that will execute as individual tasks. When components are allocated to tasks that run on separate processors, it becomes possible for multiple components to execute in parallel. But, these components still need to execute in an ordered fashion according to the rules followed for ordering. In order to achieve this requirement, the components are allocated into a sequential list, and then placed into individual tasks. The placement is accomplished by creating a copy of the sequential ordering for each of the tasks. Each copy is then modified so that it only contains the component calls that are allocated to that task. As this takes place, additional data handling mechanisms are added to the code to facilitate the movement of data generated by a component in one task, but is used by a component that is allocated to a different task.

Define Code Variables 809 for data flows and parsing of component reuse code into the an AST 810 are the same as discussed before in FIG. 4. The next step takes the code structures for each task and creates a component AST skeleton 812. This is performed as described before in FIG. 4, but done for each task ordering instead of a single ordering.

The behavior model is converted and an AST skeleton is generated 814 that implements the model. The behavior model is composed of state machines and scenarios. The scenarios are converted into state machines. Then all the state machines are reduced to state-event tables. The state event tables can then be converted into the code-like structure of an AST.

Optimization 816 is performed during code generation to reduce the overhead associated with component based software design and to apply target specific optimization techniques. The optimization process reduces overhead by simplifying the interfaces between components. Optimization techniques such as component inlining, constant propagation across interfaces, and interface reduction are used. The component inlining process expands the component code in place of a call to the component. The constant propagation across interface process customizes a component so that instead of passing a parameter to the component, the component's code has the parameter with an inlined constant value. This provides a simpler interface because fewer parameters are passed to the component and constant definition at compile time facilitates further optimization. The interface reduction method reduces the number of parameters that are passed to a component by bundling parameters into a data structure, so that only a single address needs to be passed or by allocating parameters to global memory eliminating the need to pass all the parameters. These techniques are made possible by examining the models logical and physical use of the components. For instance, if examination shows a component is used multiple times, a size vs speed tradeoff may be made. If size constraints can be met, then speed can be increased by maintaining separate copies of the customized component. If size constraints cannot be met, then a function call mechanism may be generated and use a single generic component parameterized on use.

The final two steps for converting the AST to code 818 and generating compiler files 820 are performed as described in FIG. 4.

Figure 9:
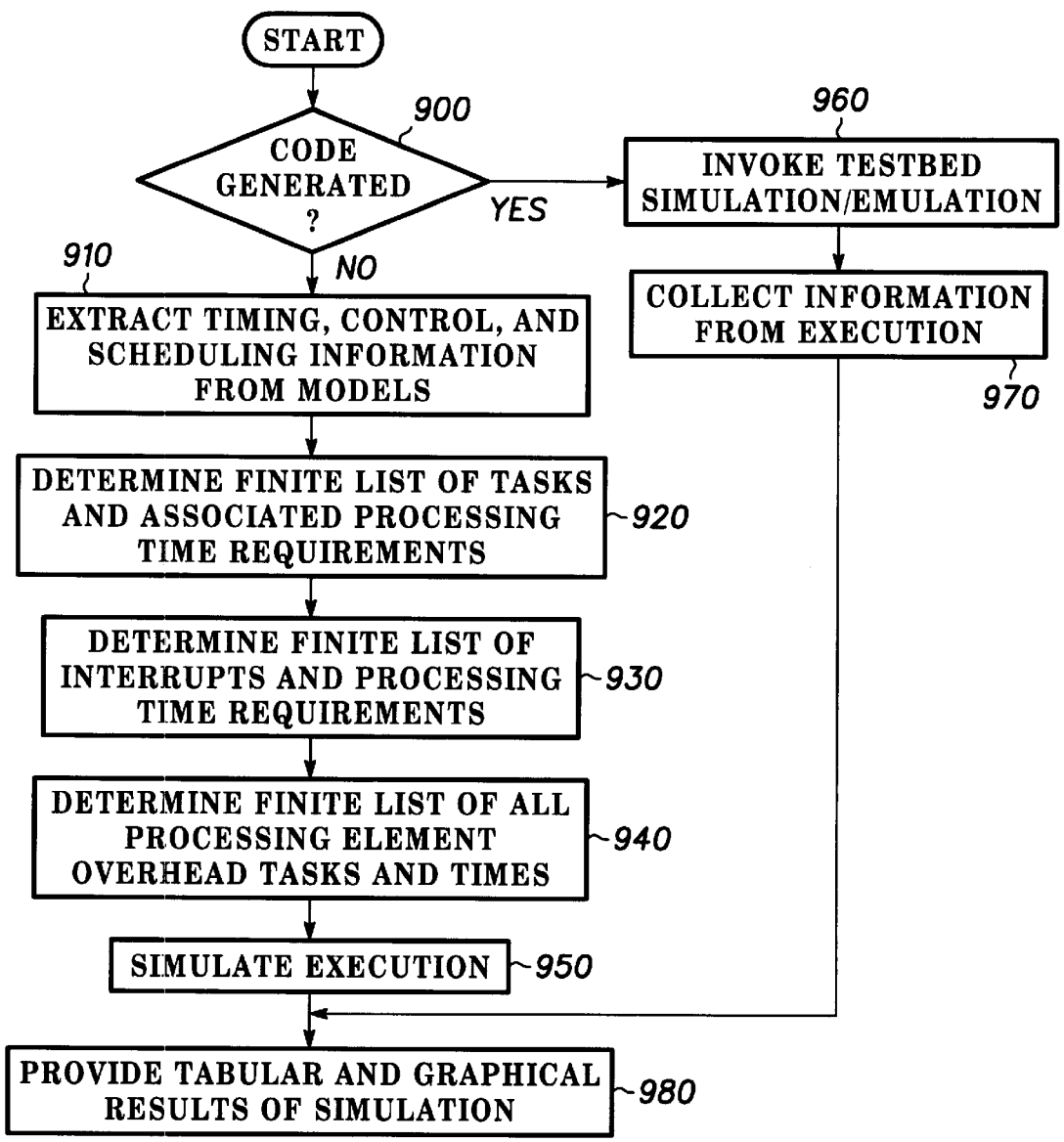

FIG. 9 provides a flowchart of steps for simulation and analysis support in the present invention. Two type of analysis are useful, timing and control; and correctness. If code has not been generated 900, static analysis provides timing and control information for the design information. This is also termed profiling. Information on timing, control and scheduling are extracted from the models 910. Complimented with additional information stored in the library estimates are made for all processing required in the system. Considerations are made for the physical processing time of elements such as clock speed of the processor and overheads for the processing elements such as task context switch time and interrupt processing. Once the information is available, a finite list of processing and system tasks and associated processing time requirements 920, a finite list of interrupts and processing time requirements 930, and a finite list of all processing element overhead tasks and times 940 is determined. The simulation 950 is performed and a schedulability prediction attained through use of techniques such as rate monotonic analysis or RMA. The RMA is based on an understanding of task execution time, period of execution and allowances for synchronization and priorities. Interrupts are profiled in place of tasks based on the assigned period of the interrupt. Whenever an interrupt is not active, the actions of the highest priority active task are profiled. Tasks are addressed in order of occurrence.

Analysis and statistics 980 are provided as user feedback in the form of plottable timing information (e.g. tasks start/stop/run times) and other statistical analysis (e.g. memory utilization, queue depths, deadline compilations, etc.) based on user requests and input constraints or default constraints based on the selected OS strategy and target architecture.

From the feedback, the user determines if the software architecture is acceptable. If not, the user modifies the system and/or application descriptions and repeats steps as referred to in FIG. 1 until an acceptable architecture is developed. The profiler provides rapid up-front verification of the system so the developer does not need to wait for actual hardware to discover system problems.

Again referring to the FIG. 9, if code has been generated 900, the supporting system testbed can be utilized 960 and testing is performed. This testbed is a combination of commercial target software simulators, commercial hardware emulators, and other test equipment required to provide simulation of the executing code without full equipment. The methods and apparatus of the present invention prepare the generated system for the testbed and provide interface to testbed commercial analysis products. The user control this process, adds directives and initiates evaluations. Information is collected 970 and provided as tabular and/or graphical results 980. This capability allows actual performance information to be evaluated.

Figure 10:
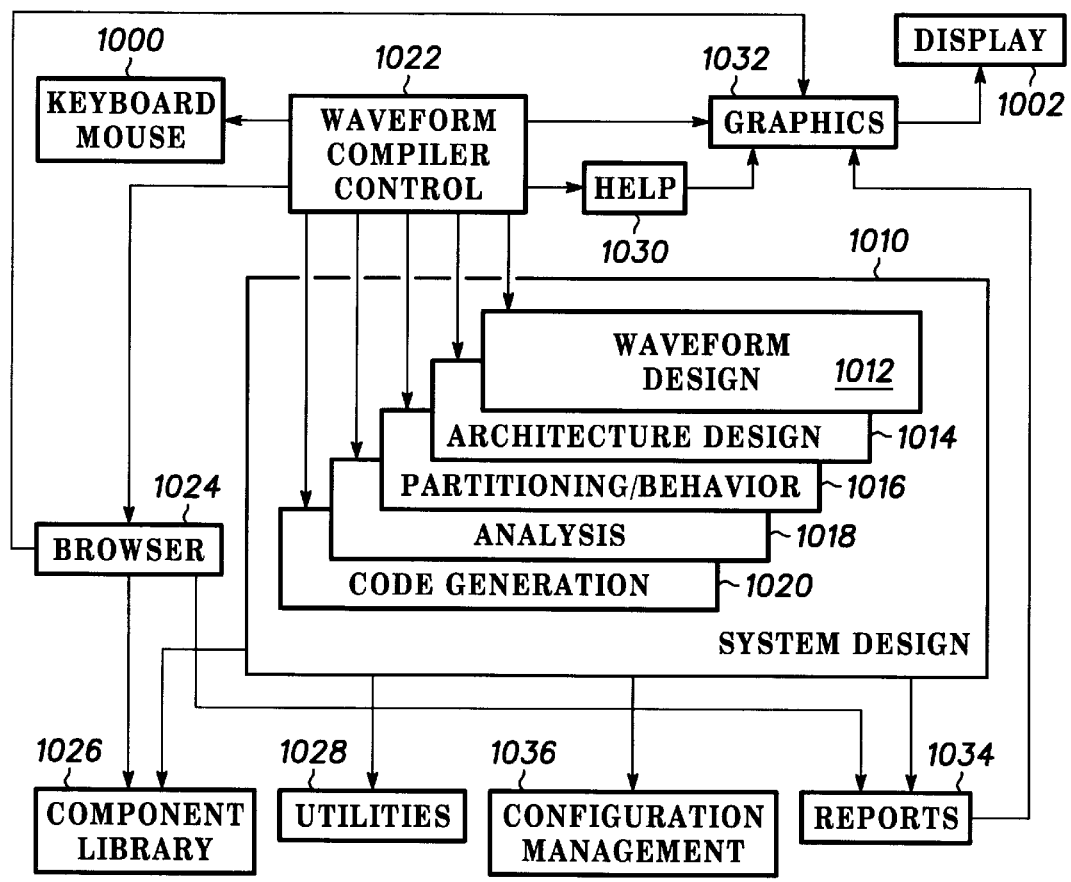
FIG. 10 illustrates the waveform compiler top level system design in accordance with the present invention.

Referring to FIG. 10, the preferred embodiment of the present invention is an open architecture to support maintainability and future enhancements. FIG. 10 provides a high level drawing identifying the major subsystems for the waveform compiler. The darkly shaded blocks in the FIG. 10 are external interfaces to the preferred embodiment including a keyboard/mouse for user entry 1000, a printer 1002 and display 1004 for user data viewing, and a disk 1006 for storage of intermediate and stored forms of data. The arrows in this diagram represents the client to supplier relationship rather than data flow. The client-server approach provides well-defined boundaries between services allowing for insertion, removal or replacement. The preferred embodiment is a combination of commercial products and custom developed software.

The lightly shaded area entitled System Design Subsystems 1010 identify the subsystems which manage and process the data entered by the user defining the user's system. These include the Application or Waveform Design Subsystem 1012, the Architecture Design Subsystem 1014, the Partitioning and Behavior Subsystem 1016, and Analysis Subsystem 1018 and a Code Generation Subsystem 1020. These subsystems are detailed in prior FIGS. 1–9.

The other boxes in the diagram are the mechanisms of the preferred embodiment infrastructure which provide control and routing of all events initiated by the user or offer services for the user or any of the other subsystems. Waveform Compiler Control 1022 is the event handler for the system. The Browser 1024 provides user review and manipulation of the modules in the Component Library 1026. The Component Library 1026 is a database of code, hardware, operating system, or previously created models from which the user may create a system. Utilities 1028 not directly associated with Help 1030, Graphics 1032, Reports 1034, or Configuration Management 1036 are part of Utilities 1028.

Figure 11:
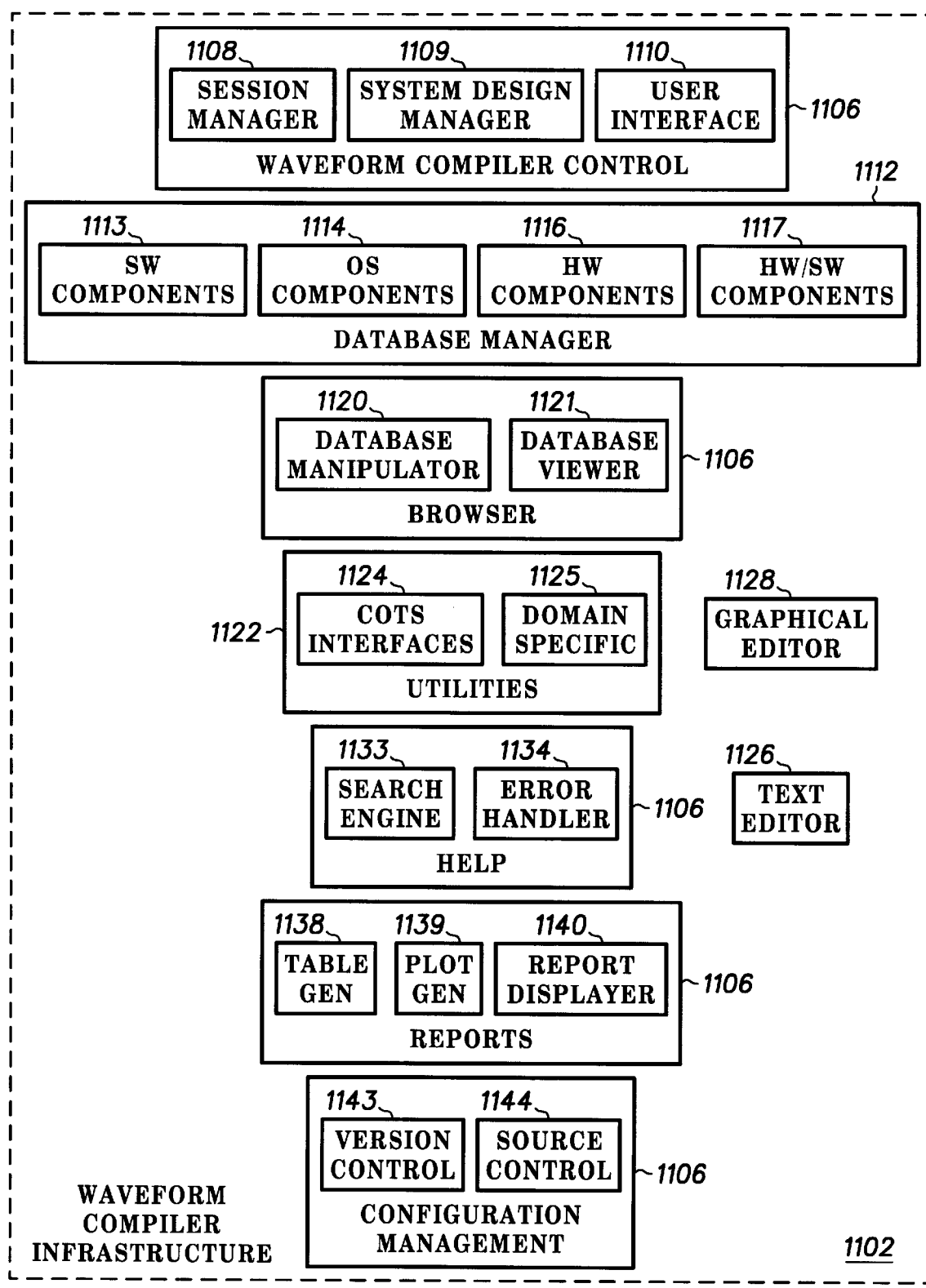

FIGS. 11 and 12 provide a high level software function decomposition for the subsystems and services illustrated in FIG. 10. These functions are separated into the Waveform Compiler Infrastructure 1102 and the System Design Subsystems 1104 functions. Referring to the FIGS. 11 and 12, the Waveform Compiler Infrastructure 1102 provides control for the environment, browsing capabilities for the component databases, graphical and text editing, various utilities, help, reports, and configuration management. The Subsystem Design Subsystems 1104 provides for capturing the user design, reduction of the design to an executable form and analysis of that design.

The Waveform Compiler Infrastructure provides the environment support services for System Design Subsystems services. Waveform Compiler Control 1006 provides processing of the user inputs and invocation of services. Within Waveform Compiler Control 1106, a Session Manager 1108 provides access mechanisms for multi-user development using the Waveform Compiler. These session services include user identification which can reject users or restrict access to libraries or services. A System Design Manager 1109 provides file manipulation services for the various models and enforces rules of system design. The User Interface 1110 processes all user inputs and invokes requested services. The User Interface 1110 also manages all background tasks to maintain the visual display and internal data structures attached to the display, The present invention enables component based development. Libraries of reusable components (source code and physical models) are managed by a Database Manager 1112 and made available to the user and internal processes. These libraries include reusable Software Components 1113 including functions, data structures, and stub functions; Operating System Components 1114 which can be specified into scheduling strategies; Hardware Components 1116 including target processors template components and other hardware components; and Hardware/Software Components 1117 providing interface mechanisms such as buffering structures and interfaces drivers. These components exist in a variety of languages, some generic and some domain specific. To facilitate optimal code generation for the target environment, these components are retargetable or are provided in a target specific form. Additionally, the interfaces to these components are designed to add minimal overhead to reduce code performance degradation to factors such as size and speed.

A third party database system is invoked in the apparatus of the current invention for library component management. The Database Manager 1112 provides the utilities for creation, addition, deletion, and modification of components, libraries, and categories within libraries. The user peruses the libraries through the Browser 1118. The Browser 1118 provides a Database Manipulator 1120 and a Database Viewer 1121. The Database Manipulator 1120 allows the user to create their own libraries by copying and then modifying existing components, create new components externally and then add them to a custom library, search for components that meet a specified criteria, and establish access restrictions for components in the library. The Database Viewer 1121 provides utilities for the user to browse the hierarchically organized modules stored in the component libraries and view the component's library card information.

A Text Editor 1126 and a Graphical Editor 1128 are available as services to any of the data entry functions of the preferred embodiment. Graphical editing provides drawing capabilities for the user such as drawing lines to connect components and moving components represented by boxes around on the drawing palette. The text editing capabilities allow the user to add/modify/delete labels on the graphical representations or add/modify/delete text from any of the user input screens.

Utilities 1122 in the infrastructure offer services for the user to integrate in Commercial Off The Shelf (COTS) products 1124 such as a target specific compiler and provide Domain Specific 1125 analysis routines.

Help 1130 services within the infrastructure of the preferred embodiment are central resources which can be invoked by any of the other subsystems. A general Search Engine 1133 is in Help 1130 so it is readily available to be spawned for any use. An Error Handler 1134 is located in Help 1130. An error may be detected by another subsystem but the interaction with the user is managed from a central routine.

Various Reports 1136 are customary to allow off-line analysis and review. A Table Generator 1138 and a Plot Generator 1129 are available to capture data executed in simulation. The Report Displayer 1140 allows that information to the provided to the user in readable form. Configuration Management 1142 of the user designs is built into the system. Both Version Control 1143 and Source Control 1144 are offered through a third party package.

The System Design Subsystems 1104 offer front end entry for the user models and back end processing and reduction of the models to the target architecture. Front end entry includes several editors each supporting user input of a specific model. Each model requires management of the user entry, capture and translation of the graphical data into data relationship model which can be manipulated, and provide services for the user to save the design and parameterize information. The main editors are the Application Editor 1146 the Architecture Editor 1150, the Behavior Editor 1158, and the Constraint Editor 1187.

The Application Editor 1146, Architecture Editor 1150, and Behavior Editor 1158 each include a manager, Application Manager 1147, Architecture Manager 1152, Partition/Behavior Manager 1159 and Constraint Manager 1187. Each manager has organizes and aligns the user inputs activities with lower level edit functions of the model and allowable back end processing. For example, the Application Manager 1147 manages the definition of component, data flows, and compound components as a single model. It provides interfaces to model naming and invocation of file naming and other services.

The Application Editor 1146 provides includes a Component Editor 1148 allowing modification to programmable options of a component such as parameters, parameter ranges, and constants. The Data Flow Editor 1149 allows specification of sequential and conditional order for application processing, interface parameters, and data flow parameters.

The Architecture Editor 1150 also provides a Component Editor 1153. In architecture design this editor allows specification of interrupts, instructions, pertinent timing and control information and optional settings available on a COTS hardware processing component. The Interface Editor 1154 allows specification of paths between components and interconnects of hardware. The Driver Editor 1156 allows interface drivers to be assigned to the interconnect of the architecture design. Lastly, an Operating System Editor 1157 allows the user to select or design a model or third party package designating the process handling for the hardware processing component.

The Behavior Editor 1158 includes editors to support merging the application with the architecture. A Resource Assignment Editor 1160 partitions the application components to the architecture components. The Task Editor 1162 provides for task creation and definition at the processing component and system level. The Scenario Editor 1163, State Editor 1164, and Message Editor 1165 provide further definition of system behavior as discussed earlier in FIGS. 6 and 7.

The Code Generator 1166, Optimizer 1174, Simulator 1180, and Analyzer 1186 provide back end processing and synthesis of the user design models into target ready software. Model Processing 1167 within the Code Generator 1166 decomposes and parses all models reducing them to the unoptimized concatenations of source code from the library components. The Language Compiler 1168 invokes the requested third party language compiler. The source code is parsed into a syntactical form by the Parser 1170 and provided as input to the Optimizer 1174. The Optimization Manager 1176 handles the application of the Language Optimizer 1177 or the Target Optimizer 1178 until the resulting code meets system constraints. The Target Memory Mapper 1172 groups the target code for unique processor addressing and organizes any directives for COTS link/load utilities.

Various forms of simulation and analysis are available. The Simulator 1180 invokes System 1181, Event 1182, or Code 1184 simulation through third party products. The Analyzer provides a Utilization Estimator 1188 in support of the Execution Profiler 1190 and Verification 1192 discussed in FIG. 9.

Improvements to functionality, flexibility or extend services for the systems engineer in accordance with the present invention include:

1. Creation of reuse libraries for other domain areas. The present invention includes system specification and code generation capabilities. The limits of what systems can be created is limited by the types of modules in a library. For example, modules can be added to support information security or other hardware models;

2. Automatic partitioning of a waveform to a target architecture. Initially, the user iterates on the design until constraints are met. An expert system or other means to automate the assignment and partitioning of modules can be incorporated into the present invention and determine a compliment of components that meet the user constraints. This reduces user cycle time further;

3. Support to extend the simulation capability to a full target testbed. To fully checkout code, the user downloads the code to the processors in their target testbed. The waveform compiler can also bridge to a system simulation environment like Bones and includes additional support to incorporate a hardware testbed for the waveform compiler;

4. the ability to migrate to use of a meta-language to create new versions of components and facilitate retargeting of applications to other targets. This intermediate language form is translated as specified by a user.

5. Optimization techniques to provide generated code which performs on par with hand generated code. While the communication engineer can identify several techniques to apply, the communication engineer could find more are needed, which can be accommodated;

6. Promoting promote reuse and technology sharing while maintaining control on key business assets, a distributed version of the waveform compiler using a standard interface approach facilitating a multi-facility, multi-user approach which incorporates access control concepts.

Features of the wave form apparatus and methodology include iterative refinement, target application independence, design for reuse and portability, user library component creation, and constraint driven optimization. The preferred embodiment is a visual user interactive environment.

While specific embodiments of the present invention have been shown and described, it will be apparent to those skilled in the art that the disclosed invention can be modified in numerous ways and can assume many embodiments other than the preferred form specifically set out and described above.

Accordingly, it is intended by the appended claims to cover all modifications of the invention that fall within the true spirit and scope of the invention.

What is claimed is:

1. A method for generating a waveform compiler using a computer system, said method comprising the steps of:

providing a library of reusable components including software components, operating system components, hardware components and hardware/software components;

said software components including function, data structures and stub functions;

said hardware components including target processes, template components and other hardware components;

said hardware/software components including interfaces, buffering structures and interface drivers;

providing multi-user access to the waveform compiler for parallel developments;

creating a functional model of a waveform application as a data flow type graph;

partitioning the functional model of the waveform application into tasks;

generating an application model from the functional model;

creating a behavior model of system tasks and application tasks including state machines and scenarios;

creating from said tasks the behavior model;

analyzing the tasks using the behavior model;

generating target code using the behavior model; and said step of generating target code includes a step of selecting at least one of the reusable components from a group of the software components, operating system components, hardware components and hardware/software components.

2. The method as claimed in claim 1, wherein there is further included the step of:
   analyzing the target code.

3. A method of developing a communications system, comprising:
   receiving hardware architecture requirements and constraints for hardware of the communication system;
   creating a hardware architecture design that substantially meets said hardware architecture requirements and constraints through selection, parameterization and interconnection of reusable hardware processing elements provided in a hardware library;
   producing a hardware architecture model from said hardware architecture design, said hardware architecture model providing a representation of a target hardware configuration for execution of said software application model;
   receiving software application requirements and constraints for software of the communication system;
   creating a software application design that substantially meets said software application requirements and constraints through selection and interconnection of reusable software processing elements provided in a software library, said creating of said software application design performed without considering said hardware architecture design and said hardware architecture model;
   producing a software application model from said software application design, said software application model providing a functional model of processing steps that substantially meet said software application requirements and constraints;
   producing a target system specification by merging said software application model and said hardware architecture model, including:
      partitioning said reusable software processing elements of said software application model to said reusable hardware processing elements of said hardware architecture model and a behavior model, said behavior model providing operational rules for said software application model to function on said hardware architecture model to substantially meet target system requirements and constraints;
      producing a partition model from said partitioning said reusable software processing elements of said software application model to said reusable hardware processing elements of said hardware architecture model and said behavior model, said partition model providing a processing map of said reusable software processing elements to said reusable hardware processing elements;
      generating a target source code using said target system specification, said reusable software modules provided in a software library and said reusable hardware templates provided in a hardware library;
      analyzing said target source code by reviewing output produced through execution of said target source code.

4. The method of claim 3, wherein creating a software application design that substantially meets said software application requirements and constraints through selection and interconnection of reusable software processing elements provided in a software library comprises:
   conducting parameterization of said reusable software processing elements, said parameterization of said reusable software processing elements including specification of user definable parameters of said reusable software processing elements;
   performing data flow specification of said reusable software processing elements, said data flow specification of said reusable software processing elements including specification of data flow from an output of a first reusable software processing element of said reusable software processing elements to an input of a second reusable software processing element of said reusable software processing elements;
   performing data flow parameterization of a data flow method used to transfer data between said reusable software processing elements;
   grouping a third reusable software processing elements with a fourth reusable software processing element to form a compound component, said compound component providing a hierarchy of design details; and
   adding said compound component to said software library for creation of a second software application design that substantially meets a second set of software application requirements and constraints.

5. The method of claim 3, wherein creating a hardware architecture design that substantially meets said hardware architecture requirements and constraints through selection, parameterization and interconnection of reusable hardware processing elements provided in a hardware library comprises:
   conducting parameterization of said reusable hardware processing elements;
   designing hardware interconnects of said reusable hardware processing elements, said hardware interconnects specifying constructs used for movement of data between said hardware processing elements;
   performing hardware interconnect parameterization, said hardware interconnect parameterization identifying software drivers for interconnection of said hardware interconnects; and
   conducting a comparison of estimated resource utilization of said reusable hardware processing elements with desired resource utilization of said reusable hardware processing elements, said comparison using constraint information extracted from component attribute information associated with each of said hardware processing elements.

6. The method of claim 3, wherein partitioning said reusable software processing elements of said software application model to said reusable hardware processing elements of said hardware architecture model and a behavior model comprises:
   identifying software processing tasks and assigning at least one of said reusable software processing elements to said software processing tasks;
   creating target system tasks, said target system tasks providing a description of tasking in said target system specification;
   assigning said software processing tasks to said target system tasks;
   assigning said software processing tasks and said target system tasks to said reusable hardware processing elements.

* * * * *